US007005708B2

(12) United States Patent
Mergens et al.

(10) Patent No.: US 7,005,708 B2
(45) Date of Patent: Feb. 28, 2006

(54) MINIMUM-DIMENSION, FULLY-SILICIDED MOS DRIVER AND ESD PROTECTION DESIGN FOR OPTIMIZED INTER-FINGER COUPLING

(75) Inventors: Markus Paul Josef Mergens, Ravensburg (DE); Koen Gerard Maria Verhaege, Gistel (BE); Cornelius Christian Russ, Princeton, NJ (US); John Armer, Middlesex, NJ (US); Phillip Czeslaw Jozwiak, Plainsboro, NJ (US); Bart Keppens, Gistel (BE)

(73) Assignees: Sarnoff Corporation, Princeton, NJ (US); Sarnoff Europe, Gistel (BE)

( * ) Notice: Subject to any disclaimer, the term of this patent is extended or adjusted under 35 U.S.C. 154(b) by 58 days.

(21) Appl. No.: 10/435,817

(22) Filed: May 12, 2003

(65) Prior Publication Data

US 2004/0164354 A1 Aug. 26, 2004

Related U.S. Application Data

(63) Continuation-in-part of application No. 10/159,801, filed on May 31, 2002, now abandoned, and a continuation-in-part of application No. 09/881,422, filed on Jun. 14, 2001, now Pat. No. 6,583,972.

(60) Provisional application No. 60/449,093, filed on Feb. 20, 2003.

(51) Int. Cl.
*H01L 23/62* (2006.01)

(52) U.S. Cl. ...................... 257/360; 257/355; 257/356; 257/361; 361/56; 361/100

(58) Field of Classification Search ................ 257/355, 257/356, 357, 360, 361; 361/56, 100, 101
See application file for complete search history.

(56) References Cited

U.S. PATENT DOCUMENTS

| | | | | |
|---|---|---|---|---|
| 5,874,763 | A * | 2/1999 | Ham | 257/360 |
| 6,388,292 | B1 * | 5/2002 | Lin | 257/356 |
| 6,424,013 | B1 * | 7/2002 | Steinhoff et al. | 257/355 |
| 6,433,979 | B1 * | 8/2002 | Yu | 361/56 |
| 6,441,438 | B1 * | 8/2002 | Shih et al. | 257/355 |
| 6,624,487 | B1 * | 9/2003 | Kunz et al. | 257/409 |
| 6,864,536 | B1 * | 3/2005 | Lin et al. | 257/355 |

OTHER PUBLICATIONS

W. Wolf, Modern VLSI Design, 1994, PTR Prentice Hall, pp. 49 and 54.*

* cited by examiner

*Primary Examiner*—George Eckert
(74) *Attorney, Agent, or Firm*—William J. Burke, Esq.

(57) ABSTRACT

An electrostatic discharge (ESD) MOS transistor including a plurality of interleaved fingers, where the MOS transistor is formed in an I/O periphery of and integrated circuit (IC) for providing ESD protection for the IC. The MOS transistor includes a P-substrate and a Pwell disposed over the P-substrate. The plurality of interleaved fingers each include an N+ source region, an N+ drain region, and a gate region formed over a channel region disposed between the source and drain regions. Each source and drain includes a row of contacts that is shared by an adjacent finger, wherein each contact hole in each contact row has a distance to the gate region defined under minimum design rules for core functional elements of the IC. The Pwell forms a common parasitic bipolar junction transistor base for contemporaneously triggering each finger of the MOS transistor during an ESD event.

29 Claims, 6 Drawing Sheets

400

MINIMUM-DIMENSION, FULLY-SILICIDED MOS DRIVER AND ESD PROTECTION DESIGN FOR OPTIMIZED INTER-FINGER COUPLING

This patent Application claims the benefit of U.S. Provisional Application Ser. No. 60/449,093, filed Feb. 20, 2003; this Application is a Continuation-in-Part of U.S. patent application Ser. No. 09/881,422, filed Jun. 14, 2001, now issued U.S. Pat. No. 6,583,972; and this Application is a Continuation-in-Part of U.S. patent application Ser. No. 10/159,801, filed May 31, 2002, now abandoned, the contents of which are incorporated by reference herein in their entireties.

CROSS REFERENCE TO RELATED APPLICATION

1. Field of the Invention

The present invention relates to electrostatic discharge (ESD) protection devices. More specifically, the present invention relates to minimal design rules for metal oxide semiconductor (MOS) type ESD devices.

2. Background of the Invention

Improvements in technology and semiconductor fabrication have allowed for increases in integrated circuit (IC) component (e.g., transistor) speed, as well as the reduction in size (real estate) required to facilitate the functional aspects of a particular IC device. The ESD protection circuitry, which is used to protect the IC from undesirable ESD events, is formed on the periphery of the IC between the bond pads and the core circuitry of an IC. It is noted that primarily the core circuitry of an IC chip comprises the functionality of the chip.

To achieve adequate ESD protection levels with high failure thresholds and good clamping capabilities, the ESD protection devices are typically provided with sufficient device width. Advances in minimal design rules (MDRs) have enabled reductions in silicon consumption required to form the core circuitry, however the ESD protection devices formed in the periphery of the IC have not been reduced according to the same minimal design rules associated with the core functional elements. Specifically, the ESD performance per micron (um) transistor width does not improve when scaling down. Rather, conventional industry wisdom teaches that the ESD devices (e.g., MOS devices) do not provide comparable ESD protection when certain design parameters (other than only the width) of such ESD devices are also scaled down.

Various problems have accompanied conventional ESD protection techniques. For example, large ESD protection device widths may be used to protect against large ESD events. In integrated circuit design, large device widths may be achieved by using a multi-finger layout. Multi-finger turn-on (MFT) relies on subsequently reduced triggering voltage after snapback of the first finger. Multi-finger turn-on problems mean that only some of the fingers of the transistor actively conduct the ESD currents, while the other transistor fingers do not turn on (i.e., remain un-triggered). Furthermore, advanced CMOS technologies require high numbers of MOS fingers, since decreasing pad pitch and maximum active area width is largely restricted by design rules. For a detailed understanding of providing multi-finger turn-on ESD devices, the reader is directed to U.S. Pat. No. 6,583,972,which is incorporated by reference herein in its entirety.

Additionally, fully silicided multi-finger NMOS designs are typically very susceptible to ESD currents because of an absence of ballasting resistance and insufficient voltage built-up across a current conducting finger. Moreover, to enhance the IC's latch-up immunity, often substrate ties are introduced between different blocks or fingers of the NMOS driver transistor, which needed to be split because of I/O cell pitch constraints.

FIG. 2 depicts a prior art fully silicided NMOS multi-finger transistor layout 200 having a P+ substrate ring 210 and at least one local P+ substrate tie 208. The local substrate tie 208 separates two driver blocks $\mathbf{202}_1$ and $\mathbf{202}_2$ of the multi-finger NMOS transistor. Such a local substrate tie 208 is frequently used in I/O cells to enhance latch-up immunity of the driver circuit.

For example, each driver block $\mathbf{202}_1$ and $\mathbf{202}_2$ respectively comprise fingers $\mathbf{204}_1$ to $\mathbf{204}_6$ and fingers $\mathbf{204}_7$ to $\mathbf{204}_{12}$. Each finger 204 of each block 202 is adjacent to another finger (e.g., fingers $\mathbf{204}_1$ and $\mathbf{204}_2$), where each finger 204 comprises a source region 220, an adjacent drain region 222, and a gate region 224 disposed over and formed between the source and drain regions 220 and 222. The drain region 222 comprises a plurality of contacts $\mathbf{226}_D$ formed in a row. Likewise source region 220 also comprises a plurality of contacts $\mathbf{226}_s$ formed in a row. Typically, the substrate ring 210 and/or substrate ties 208 must not be further than approximately 20–50 microns away from the furthest point in the drain and source regions 222 and 220 of each finger 204 in order to satisfy Latch-Up design rules.

It is noted that the local substrate ties further disable direct coupling between the individual MOS areas/diffusions, and thereby isolate the MOS blocks regarding ESD triggering. For example, triggering the first finger $\mathbf{204}_1$ may propagate and trigger adjacent fingers $\mathbf{204}_2$ through $\mathbf{204}_6$ of the first block $\mathbf{202}_1$. However, the substrate tie 208 formed between fingers keeps the potential of the substrate underneath as low as possible, and therefore will not allow the substrate to rise to 0.7 volts to trigger the fingers $\mathbf{204}_7$ through $\mathbf{204}_{12}$ of the second block $\mathbf{202}_2$.

Thus, a concern with regard to multi-finger devices under ESD stress is the possibility of not turning on all of the fingers. That is, for example, the exemplary fingers $\mathbf{204}_1$ to $\mathbf{206}_6$ of the first block $\mathbf{202}_1$ may all trigger, but the exemplary fingers $\mathbf{204}_7$ to $\mathbf{206}_{12}$ of the second block $\mathbf{202}_2$ may not trigger due to the presence of the substrate tie 208. (It is noted that the substrate tie is, however, required for Latch-Up rules)

Another drawback of these multi-finger triggering techniques for driver and ESD protection designs is the additional silicon real estate that is required. Specifically, the size of the MOS device increases to accommodate the substrate ties 208 and substrate ring 210, as well as the implementation of additional ballast resistances, typically in the form of silicide blocked regions (not shown on FIG. 2), which significantly increases silicon area consumption and adds design complexity.

SUMMARY OF THE INVENTION

The disadvantages heretofore associated with the prior art, are overcome by the present invention of an electrostatic discharge (ESD) MOS transistor including a plurality of interleaved fingers, where the MOS transistor is formed in an I/O periphery of and integrated circuit (IC) for providing ESD protection for the IC. The MOS transistor includes a P-substrate and a Pwell disposed over the P-substrate. The plurality of interleaved fingers each include an N+ source region, an N+ drain region, and a gate region formed over a P channel disposed between the source and drain regions.

Each source and drain includes a row of contacts that is shared by an adjacent finger, wherein each contact hole in each contact row has a distance to the gate region defined under minimum design rules for core functional elements of the IC. The Pwell forms a common parasitic bipolar junction transistor base for contemporaneously triggering each finger of the MOS transistor during an ESD event.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The MOS transistor designs described above in the prior art largely diminish direct substrate-to-substrate (i.e., bulk-to-bulk) coupling between adjacent fingers, which supports multi-finger triggering under electrostatic discharge (ESD) stress conditions. This effect is mainly suppressed due to the incorporation of finger ballast resistances in conventional ESD-robust driver designs, illustratively, by introducing silicide-block drain extensions, which significantly increase the overall dimensions within the transistor.

The present invention overcomes design and fabrication techniques that are normally believed in the industry to have a detrimental effect on the ESD performance. Specifically, the design rules normally applied to the functional or core elements (e.g., transistors) of the IC are also applied to the ESD protection transistors typically located on the periphery of the IC. It is noted that minimum design rules refer to what the technology is capable of manufacturing in terms of the resolution of the photo mask, in terms of the resolution of the photo resist, and in terms of the smallest feature sizes the technology can manufacture. In the prior art discussed above, the minimum design rules (MDR) for ESD devices in the periphery 104 of an IC are significantly greater than the MDR for the core devices of the same IC.

Figure 1:
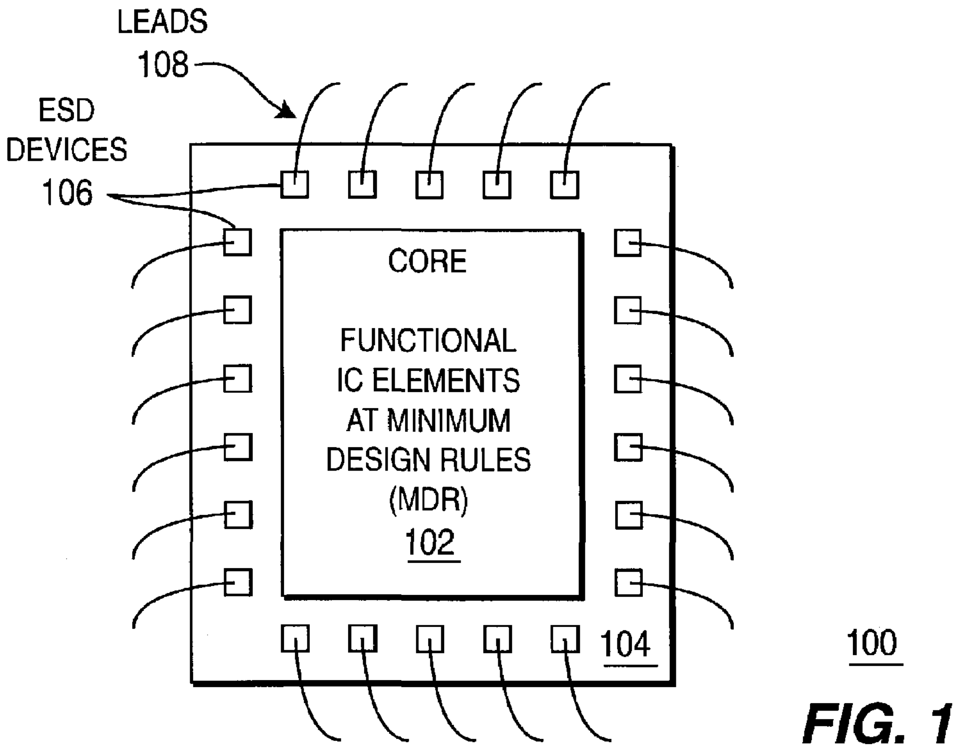
FIG. 1 depicts a block diagram of an integrated circuit (IC) provided with electrostatic discharge (ESD) protection circuitry of the present invention.

FIG. 1 depicts a block diagram of an integrated circuit (IC) 100 provided with electrostatic discharge (ESD) protection circuitry of the present invention. In particular, the IC 100 comprises core elements 102 and periphery elements 104. The core elements 102 include those active and/or passive devices (e.g., transistors, resistors, among other elements) necessary to perform various functional aspects of the IC 100. The periphery elements 104 comprise ESD devices 106 coupled to leads 108 for interfacing with external circuit interfaces. The ESD devices 106 are also coupled to I/O pads (not shown) of particular core elements 102. In accordance with the present invention, the minimum design rules for the core elements 102 may also be applied to the ESD devices 106 in the periphery 104 of the IC 100, as opposed to the prior art, where the minimum design rules for the ESD devices 106 in the periphery 104 are greater than the minimum design rules for the core elements 102.

Figure 2:
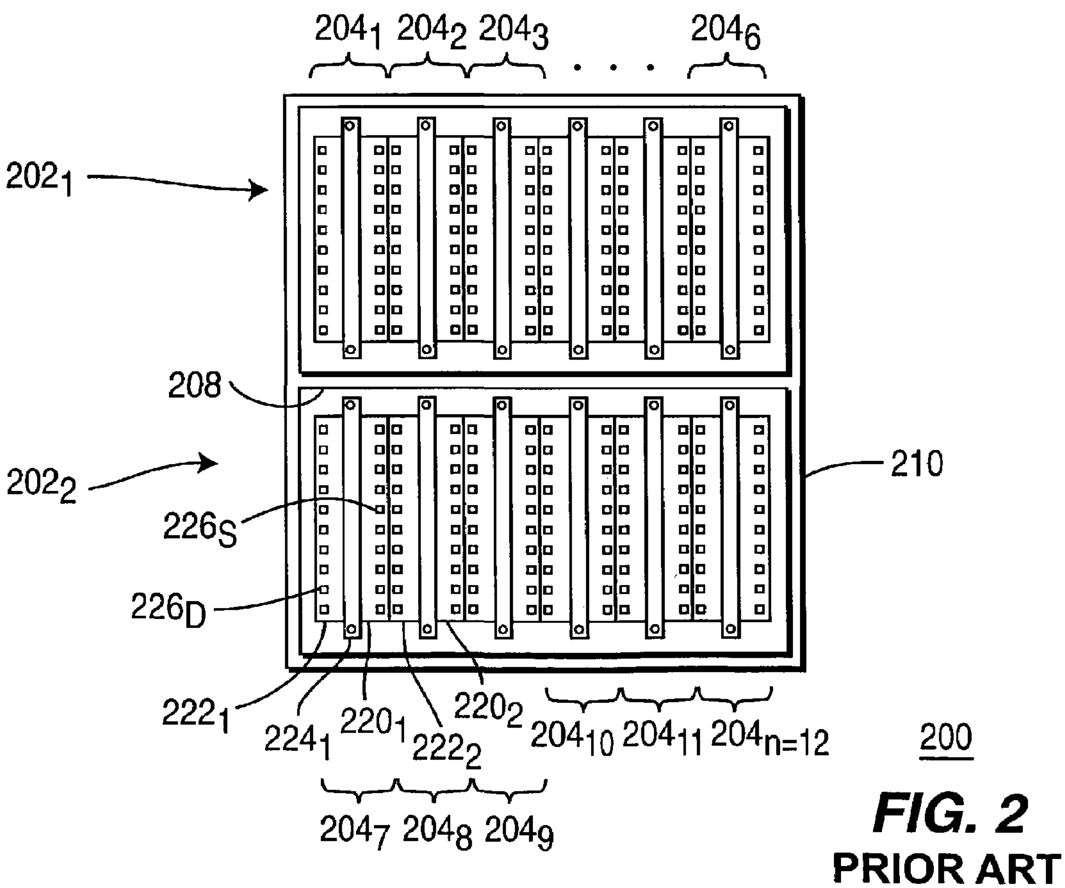
FIG. 2 depicts a prior art fully silicided NMOS multi-finger driver structure layout with a P+ substrate ring including a local substrate tie.
Figure 3:
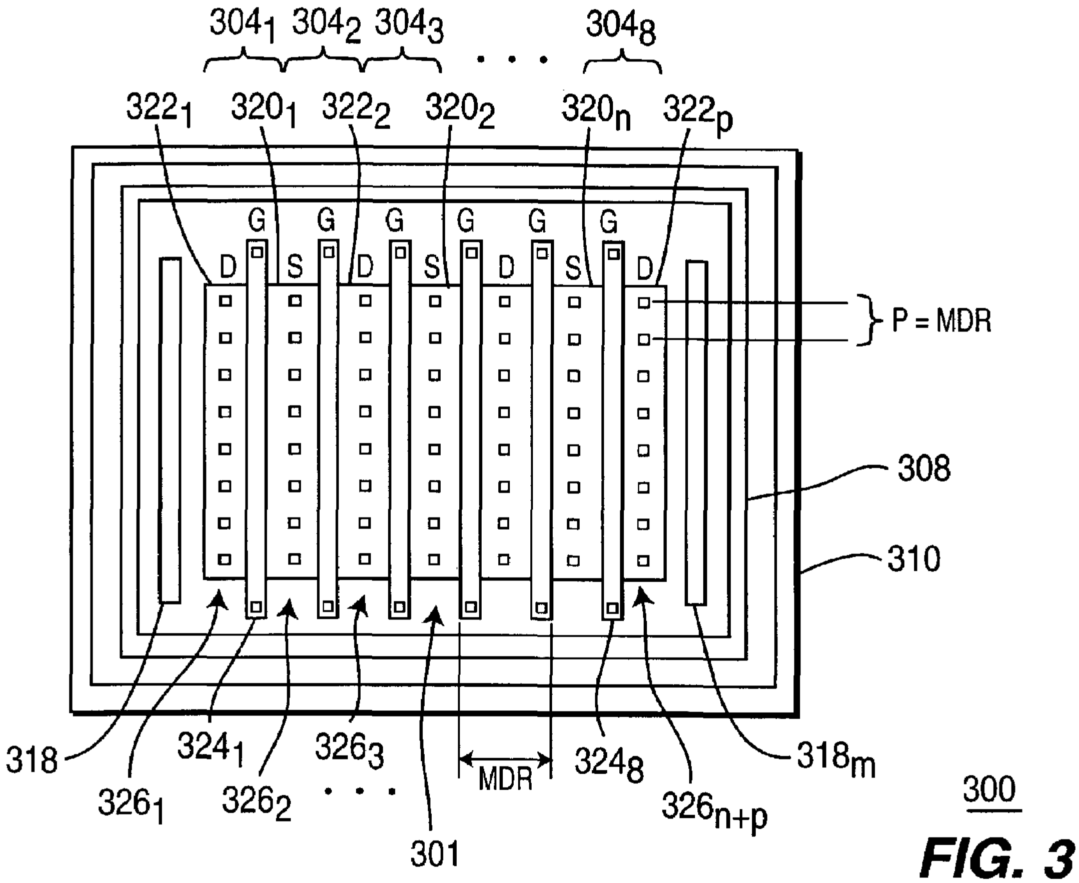
FIG. 3 depicts a top-view of a first embodiment of a MOS driver of the present invention.

FIG. 3 depicts a top-view of a first embodiment of a MOS driver of the present invention. In particular, FIG. 3 depicts a top-view layout of an exemplary fully silicided MOS driver 300 of the present invention. It is noted that the present invention is discussed in terms of NMOS ESD devices, however those skilled in the art will recognize that the present invention is also applicable to PMOS ESD devices in a similar manner. In order to allow for optimum direct bulk-coupling within a multi-finger array, minimum design rule dimensions identical to those minimum design rules for the core circuits (minimum contact-gate spacing on the drain side and on the source-side, single —i.e. shared—contact row) are introduced within standard fully silicided MOS transistors. This means that only single-contact rows in the drain and the source, respectively, are shared between two adjacent fingers. Moreover, the local substrate ties 208 that were provided in FIG. 2 have been eliminated from an active region 301 in the present embodiment of FIG. 3.

In particular, the MOS driver 300 comprises a plurality of fingers $\mathbf{304}_1$ through $\mathbf{304}_q$ (collectively fingers 304), where each finger comprises a drain region 322, a source region 320, and a gate region 324. The gate region 324 is disposed over a channel formed by a Pwell (not shown) between each source and drain region of each finger 304, in a conventional manner known by those skilled in the art (and shown and discussed with respect to FIG. 4). For example, a first finger $\mathbf{304}_q$ comprises drain region $\mathbf{322}_p$, source region $\mathbf{320}_n$, and a gate $\mathbf{324}_q$, where n, p, and q are integers greater than zero. The drain, source and gate regions 322, 320, and 324 form an active region 301 of the MOS driver 300.

The MOS driver 300 further comprises a P+ substrate ring 310, at least one substrate/bulk tie $\mathbf{318}_m$ (where m is an integer greater than 1), and an optional N-well ring 308. The P+ substrate ring 310 provides the necessary ground connection for the bulk of the MOS transistor as well as satisfies the Latch-Up rules. The substrate/bulk ties 318 are adjacent to an optional N-well ring 308 circumscribing the active region 301 of the MOS device 300, and are discussed below in further detail with respect to FIG. 4.

Fabrication of the MOS transistor 300 under the minimum design rules includes sharing the respective drain and source regions 322 and 320 between adjacent fingers 304. For example, finger $\mathbf{304}_2$ includes source region $\mathbf{320}_1$ and drain region $\mathbf{322}_2$, while adjacent finger $\mathbf{304}_3$ includes drain region $\mathbf{322}_2$ and source region $\mathbf{320}_2$. Accordingly, the exemplary drain region $\mathbf{322}_2$ is shared between adjacent fingers $\mathbf{304}_2$ and $\mathbf{304}_3$, thereby forming interleaved fingers $\mathbf{304}_2$ and $\mathbf{304}_3$.

Furthermore, only a single row of contacts 326 is formed and utilized over each source and drain region 320 and 322, such that contact rows $326_{n+p}$ are formed over the active region 301 of the transistor 300. That is, to reduce the area of the device and the increase the bulk coupling effect, the contact rows $226_s$ and $226_D$ of the adjacent source and drain regions 220 and 222 as shown in FIG. 2, are merged into a single contact row 326. For example, contact row $326_2$ is formed over the source region $320_1$, which is shared by fingers $304_1$ and $304_2$. Similarly, contact row $326_3$ is formed over the drain region $322_2$, which is shared by fingers $304_2$ and $304_3$. It is noted that the number of contacts in each row 326 over each source and drain region 320 and 322 is dependent on the size of the active area 301, as well as the latest minimum design rules for defining contact pitch "P". For current 0.13 um CMOS technologies, the contact pitch P is approximately 0.34 um.

The minimum design rules means that there is minimum contact-to-gate spacing between source and gate, as well as the drain and gate for each finger, thereby providing minimum connection and minimum distance from one source to the other source. In particular, the source-to-source distance is important for direct inter-finger bulk-coupling, since the source-bulk (i.e., emitterbase) voltage needs to reach approximately 0.7V to turn on self-biased, parasitic NPN snapback via avalanche current generation within the drain-bulk junction. Therefore, the closer the sources 320 of adjacent fingers 304, the better the locally generated bulk signal can propagate to the next inactive finger 304, thus triggering the next finger(s). These fingers can, in turn, generate a strong bulk potential due to excessive hot avalanche carrier injection at the drain junction into the substrate. The avalanche-generated carriers (e.g., holes) in the substrate diffuse to the substrate ring, which activates the neighboring finger, and so forth.

Specifically, the carriers (e.g., holes) in the substrate raise the potential in the substrate, and once that potential at the source point has reached point 0.7 volts, the source-substrate junction gets forward biased, thereby triggering the parasitic bipolar transistor. By decreasing the source-to-source distance as depicted in FIG. 3 under the conventional core minimum design rules, optimum coupling is provided between the fingers, which allows all fingers of the NMOS transistor to trigger. Note that the substrate tie 208 of FIG. 2, which interrupts coupling between the blocks 201, is no longer disposed in the active area to form undesirable blocks 202 of fingers 204.

Referring to FIG. 3 of the present invention, the compact design with MDR source-to-source distance enables all fingers 304 to turn-on during an ESD event by contemporaneous propagation of the bulk potential through the bulk, thus contemporaneously triggering all fingers. In one embodiment, for CMOS-0.13 um technologies, the source-to-source distance is in a range between 0.6 um–1.8 um, and as advancement and technology continues, such distances will further decrease as well. As noted above, the contact pitch for CMOS-0.13 um technologies under minimum design rules allow for a contact pitch (P) of approximately 0.34 um.

As a consequence, functional ESD self-protecting driver designs, as well as ESD performance width scalability within minimum silicon area can be accomplished. Moreover, optimum ESD clamping behavior (low $R_{ON}$ and thus low $V_{t2}$ (see FIG. 7 below)), as well as normal operation drive performance is achieved due to minimum load capacitance and minimum (dynamic) on-resistance.

Figure 7:
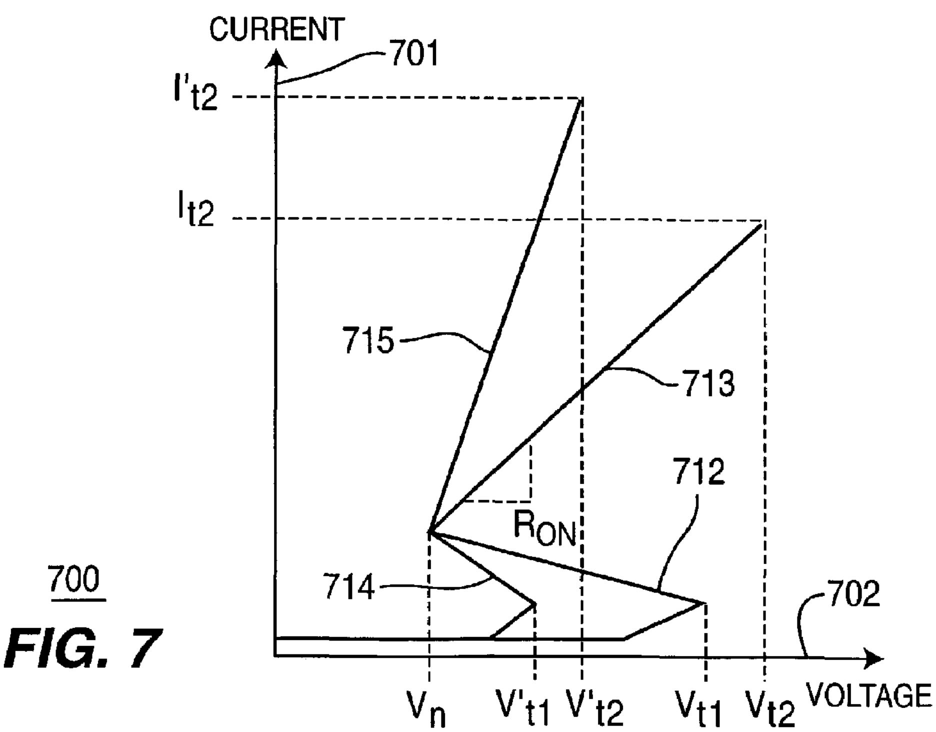
FIG. 7 depicts a graph representing current versus voltage curves for ESD devices, which are useful in describing the operation of the subject invention.

FIG. 7 depicts a graph 700 representing current versus voltage curves for ESD devices, which are useful in describing the operation of the subject invention. The graph 700 comprises an ordinate 701 representing current (I) and an abscissa 702 representing voltage (V). Curves 712 and 713 of FIG. 7 illustrate the behavior of a single parasitic BJT. When the voltage across the BJT exceeds $Vt_1$, the BJT operates in a snapback mode to conduct current, thus, reducing the voltage across the protected circuitry.

As shown by the curves 712 and 713 in FIG. 7, in order to ensure uniform turn-on of multi-finger structures, the voltage value at failure, $Vt_2$, must exceed the triggering voltage $Vt_1$ of the parasitic BJT transistor, i.e. the voltage at the onset of snapback. This ensures that a second parallel finger will trigger at around $Vt_1$, before the first conducting finger reaches $Vt_2$. Thus, damage to an initially triggered and first conducting finger can be avoided until adjacent fingers are also switched on into the low resistive ESD conduction state (i.e. snapback).

As discussed above, a concern with regard to multi-finger devices under ESD stress is the possibility of non-uniform triggering of the fingers, i.e. not all fingers are triggered during ESD stress. In order to ensure uniform turn-on of conventionally designed multi-finger structures, the voltage value at second breakdown $V_{t2}$ must exceed the triggering voltage $V_{t1}$ of the parasitic BJT transistor, i.e. the voltage at the onset of snapback, as shown in FIG. 7. Thus, an initially triggered finger being subsequently damaged as a result of an excessive current load before adjacent fingers also switch into the ESD conduction mode (i.e. snapback) may be avoided.

The conventional design philosophy to achieve a "homogeneity condition $V_{t1}<V_{t2}$", is either a reduction of the triggering voltage $V_{t1}$ or the increase of the second breakdown voltage $V_{t2}$. A common technique to increase $V_{t2}$ is by adding ballasting resistance to each finger, for example, by an increase of the drain contact to gate spacing in conjunction with silicide blocking, thus increasing the dynamic on-resistance $R_{on}$. In particular, to enhance area efficiency of MOS transistors, a "back-end-ballast" technique was introduced to ballast the MOS fingers in fully silicided technologies, thereby allowing the abandonment of the silicide-block process step. For a detailed understanding of providing back-end ballasting, the reader is directed to U.S. Pat. No. 6,587,320, issued Jul. 1, 2003.

Methods to reach a $V_{t1}$ reduction are transient gate-coupling and bulk-coupling ('pumping'), as shown by the curve 714 of FIG. 7. By statically or transiently biasing the gate or applying a potential to the bulk (i.e., BJT base) during ESD stress, respectively, $V_{t1}$ decreases towards the characteristic snapback holding voltage $V_H$ generally situated below $V_{t2}$. Gate coupling is described in an article by C. Duvvury et al. entitled "Dynamic Gate Coupling of NMOS for Efficient Output ESD Protection," IRPS 1992 (IEEE catalog number 92CH3084-1) pp. 141–150, which is incorporated by reference herein in its entirety.

The gate coupling technique typically employs a capacitor coupled between the drain and the gate of the MOS transistor. A portion of the current resulting from an ESD event is transmitted through the capacitor to transiently bias the parasitic bipolar junction transistor (BJT), which is inherent to the MOS device.

By transiently biasing the NMOS gate and/or the base of the BJT during an ESD event, the ESD trigger voltage $Vt_1$ decreases to $Vt_1'$, toward the snapback holding voltage $V_H$ intrinsically situated below $Vt_2$. The transient biasing is designed to be present for a time interval sufficient to cause all parallel fingers to fully conduct the ESD current. The gate coupling and/or substrate triggering generally change the NMOS high current characteristic from the curves 712 to the curves 714. Moreover, these techniques also make it possible for NMOS transistors with a characteristic represented by curves 712 and 713, which may be inappropriate for ESD protection, to be modified to have a more appropriate characteristic represented by curves 714 and 715.

By decreasing the source-to-source distance as shown in FIG. 3 of the present invention, the trigger voltage $V_{t1}$ is dynamically decreased for successively triggered fingers to the voltage $V_{t1'}$, while the voltage $V_{t1}$ for the first triggered finger as well as the voltage $V_{t2'}$ remain at the same, relatively low value as shown by curve 715. In particular, the triggering of the subsequently triggered fingers occur at $V_{t1'}$ trigger voltage in a range between 5–7 volts, as compared to initially triggered fingers as well as all fingers of the prior art where the $V_{t1}$ trigger voltage is typically 8–10 volts. Having a low $V_{t2'}$ voltage has the advantage of a very good clamping characteristic so it limits any ESD voltage to a very low value. Further, a low $V_{t2'}$ voltage has the advantage of protecting other components on the IC quicker, as compared to a higher $V_{t2}$ value.

In order to enhance the direct bulk-coupling effect, it is additionally beneficial to isolate the Pwell from the substrate. Typically, in high-speed applications, a triple-well option ("deep-Nwell/isolated Pwell") is provided, which isolates the Pwell from the P-substrate.

Figure 4:
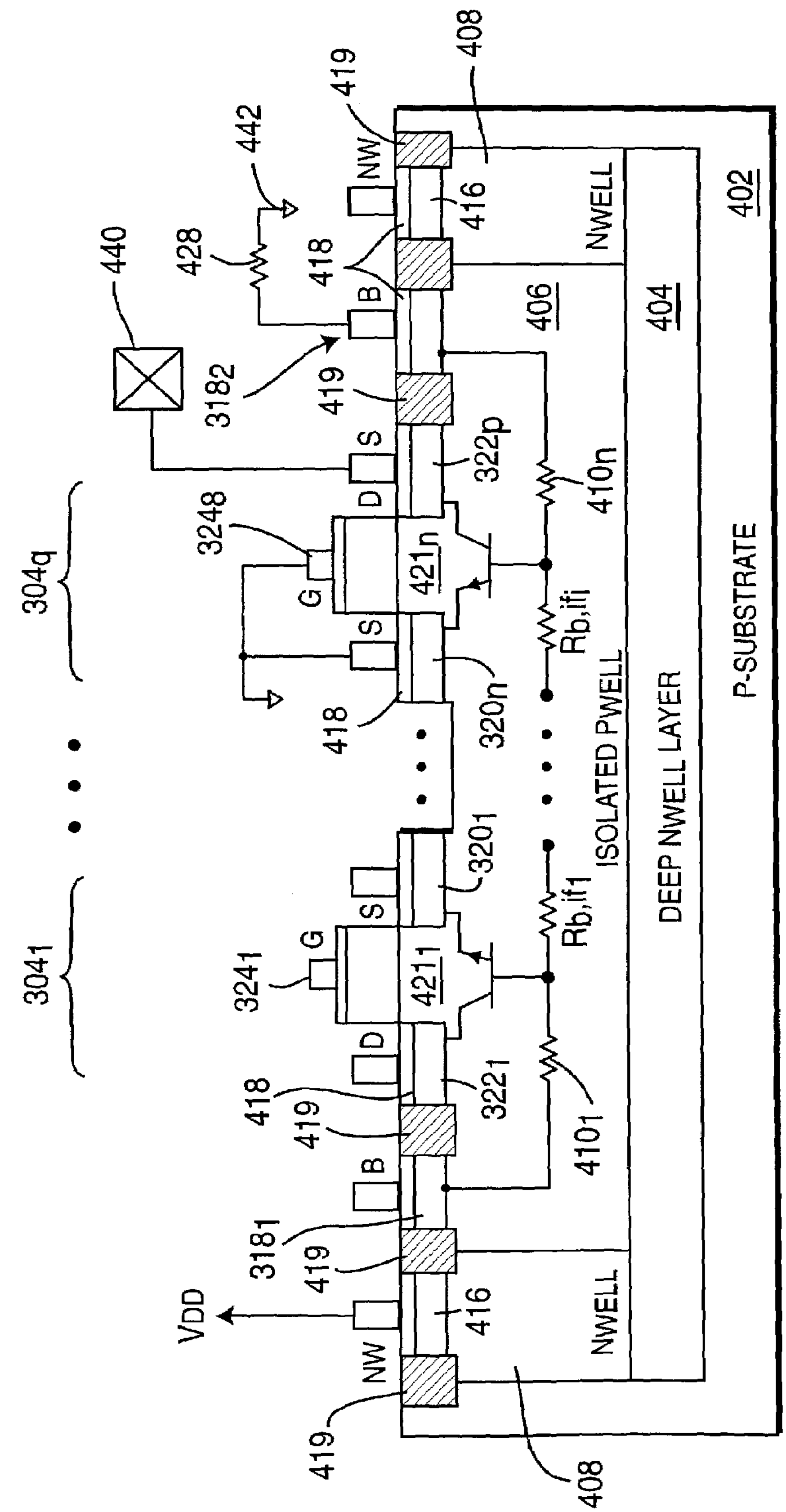
FIG. 4 depicts a cross-sectional view of a second embodiment of a MOS driver of the present invention.

FIG. 4 depicts a cross-sectional view of a second embodiment of a MOS driver 400 of the present invention. In particular, FIG. 4 represents an exemplary cross-sectional view of the MOS driver 300 of FIG. 3, except that additional features are included in this second embodiment, as discussed below. The MOS driver 400 is, illustratively, an NMOS driver comprising a P-substrate 402, a Pwell 406, an optional N-buried layer (deep Nwell) 404, lateral Nwell 408, a drain 322, source 320, and a gate 324. The N-buried layer 404 is disposed between the Pwell 406 and the P-substrate 402. Further, the lateral Nwell 408 encircles the structure forming the Nwell ring 308, and is in contact with the N-buried layer 404, thereby completely isolating the Pwell 406 from the P-substrate 402. It is noted that the deep Nwell 404 is illustratively provided for ICs used in radio frequency (RF) applications, since the isolated Pwell 406 provides good noise isolation of the P-substrate 402 from the core devices.

FIG. 4 illustratively shows a plurality of adjacent fingers $\mathbf{304}_q$ formed in the Pwell 406. Recall, in FIG. 3, the plurality of fingers $\mathbf{304}_q$ form an active region 301 of the NMOS transistor. As discussed above with respect to FIG. 3, each exemplary NMOS finger 304 comprises a high-doped N+ drain region 322 and a high-doped N+ source region 320, separated by a channel 421 of the Pwell 406. Specifically, the N+ source and drain regions 320 and 322 respectively form the channels $\mathbf{421}_q$ therebetween.

Each gate region 324 is disposed over the channel 421 in a conventional manner known in the art. At least one high-doped P+ bulk tie (e.g. bulk ties $\mathbf{318}_1$ and $\mathbf{318}_2$) is also disposed in the Pwell 406 proximate the exemplary drain and source regions 322 and 320 of the outer (end) fingers $\mathbf{304}_1$ and $\mathbf{304}_q$. That is, the bulk tie 318 is disposed adjacent (outside) of the active region 301. In one embodiment, the bulk tie 318 is coupled to ground 442 via an external resistor 428, and is separated from the outermost source and drain regions 320 and 322 by shallow trench isolation 419. The bulk tie 318 is used to provide a resistive grounding for the isolated Pwell 406.

A high-doped N+ region 416 is interspersed in the lateral Nwell 408, and is separated from the other high-doped regions via shallow trench isolation. The lateral Nwell 408 in conjunction with the N+ doped region 416 forms the Nwell ring 308 illustratively circumscribing the active region 301 of the NMOS transistor, as shown in FIG. 3.

The drain 322 is coupled to an I/O pad 440 of the IC 100. Further, the drain and source regions 322 and 320 of each finger 304 are separated from the bulk ties 318 via shallow trench isolation 419. It is noted that the MOS device is fully silicided over the high-doped regions, as shown by the silicide regions 418.

In the exemplary embodiment shown, the gate 324 is coupled to the source 320 and ground 442. Alternately, the gate 324 may be connected to a pre-driver, such that the NMOS device 400 acts as a self-protecting driver.

Further, the lateral Nwell 408 may be optionally coupled to a supply line $V_{DD}$ via the N+ regions 416. The lateral Nwell 408 is typically connected to the positive supply voltage to bias it high during normal operation. A schematic diagram of a parasitic bipolar transistor is illustratively shown in FIG. 4, where the source 320 forms an emitter, the drain 322 forms a collector, and the channel/Pwell 421/406 forms a base of a parasitic bipolar transistor. In an instance where the bulk tie 318 is coupled to ground 442, an internal base resistance 410 arises, illustratively having a resistance in the range between 100 to 2000 ohms. Otherwise, the internal base resistance 410 is a floating resistance.

In a first alternate embodiment, the N-buried layer 404 is floating. In particular, the lateral Nwells 408 may not actually contact the N-buried layer 404, or the Nwells 408 may be excluded altogether. However, in either case, the N-buried layer 404 substantially isolates the Pwell 406 from the P-substrate.

In a second alternate embodiment, the isolated Pwell 406 is floating. This usually has the best and most beneficial effect on the ESD properties of the MOS transistor in terms of uniform triggering and utilizing the dV/dt triggering effect (displacement current through the drain-bulk junction capacitance transiently lifting the bulk potential and ensuring triggering at a lower voltage). However, it is noted that a totally floating isolated Pwell may have a detrimental circuit effect such as increased leakage current during normal circuit operation conditions. Therefore, it is not always possible to use a totally floating Pwell 406. One technique to overcome the increased leakage current is to provide a resistively grounded Pwell. That is, the Pwell may be resistively grounded by combination of the internal base resistance 410 of the NPN bipolar transistor and an external resistor (428) to ground in the range of 1 to 50 kilo-ohms.

In a third alternate embodiment, the N-buried layer 404 is not provided. In this instance the lateral Nwells 408 are provided and form an Nwell ring 308 to substantially isolate the Pwell 406 from the P-substrate 402. Within such a quasi-isolated Pwell 406, the avalanche-generated carriers efficiently raise the Pwell potential. Specifically, each of the above-mentioned embodiments substantially or completely isolates the P-well 406 from the P-substrate 402. The isolated Pwell 406 provides a very good interconnection between all the fingers of a transistor formed in this Pwell. As such, coupling (i.e., propagating an increased potential) in the isolated Pwell 406 uniformly turns on all the fingers 304. That is, since the isolated Pwell 406 forms the common base region of each bipolar transistor of each finger 304, which are connected together through the inter-finger base resistors $R_{b,if1}$ through $R_{b,ifi}$ (where i is an integer greater than 1), the fingers uniformly and contemporaneously trigger.

It is noted that the bulk tie 318 is shown as having a high ohmic resistive connection 428 to ground 442. Alternatively, current may be injected externally through the bulk tie 318. In particular, the bulk tie 318 may be coupled to an external trigger device to provide an external current source to provide uniform triggering of the NMOS device 400.

It is further noted that epitaxial technologies contain extremely low resistive substrates 402, and a sufficient single finger ESD performance as well as uniform turn-on of multiple fingers can be difficult to achieve. In particular, an epitaxial layer with a lowly resistive substrate 402 has a very good connection to the ground 442. Normally, a low resistive substrate is very desirable for noise reduction in the substrate such as in RF applications, as well as for having a high latch-up hardness. However, the use of a deep Nwell 404 to create an isolated Pwell 406 is very beneficial for ESD protection of epitaxial technologies, as discussed above.

Figure 5A:
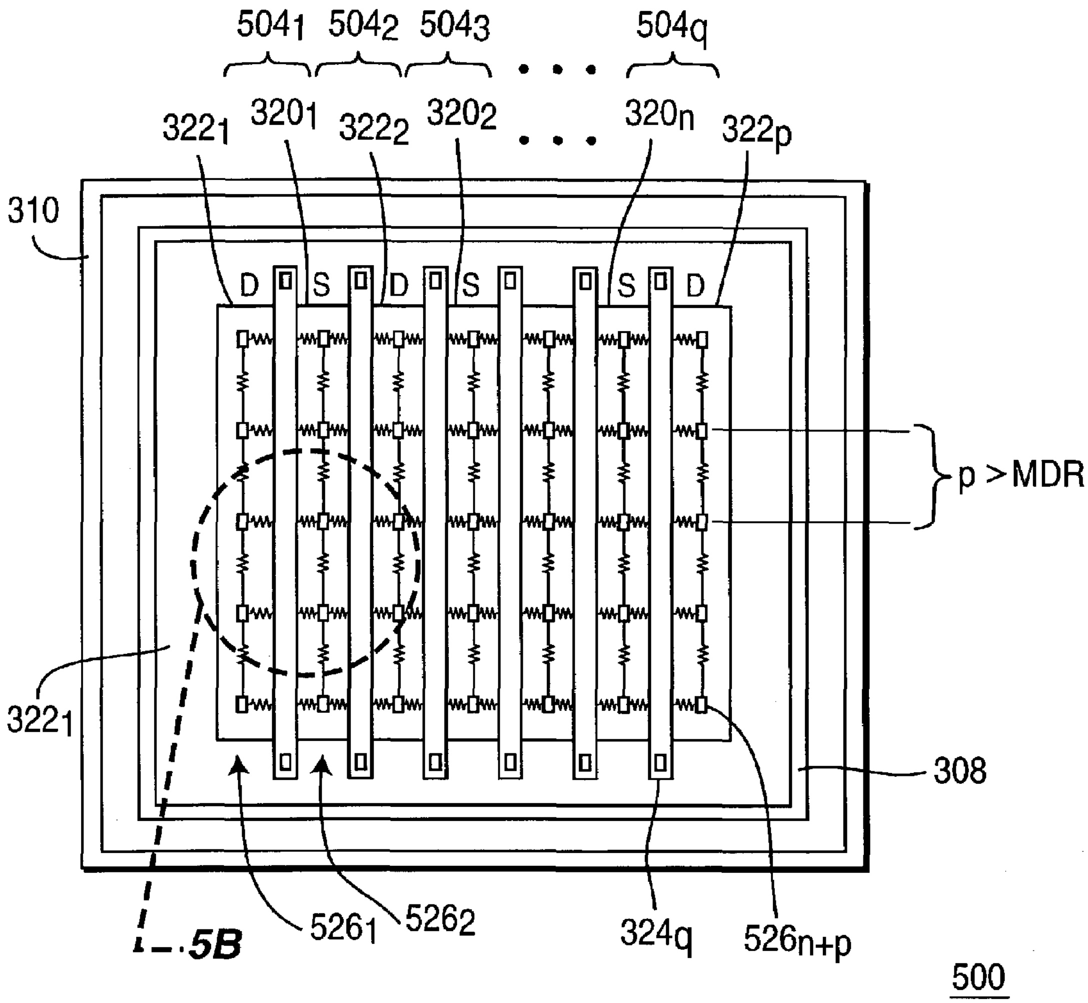
FIGS. 5A and 5B together depict a top-view of a third embodiment of a MOS driver of the present invention.
Figure 5B:
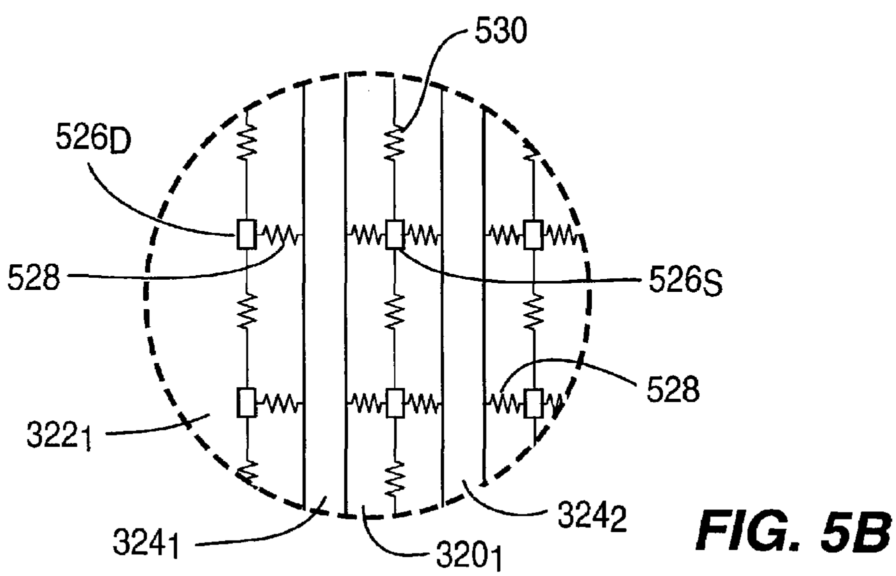

FIGS. 5A and 5B together depict a top-view of a third embodiment of a MOS driver 500 of the present invention. In particular, FIGS. 5A and 5B depict a fully-silicided MOS driver utilizing a segmentation scheme hereinafter termed "contact pitch segmentation." The layout shown in FIG. 5A is the same as the layout of FIG. 3, except that the contact pitch (P) is greater than the MDR shown in FIG. 3. It is noted that the P+ bulk 318 ties have been left out for simplicity. Recall that the current minimum design rules MDR enable a contact pitch of approximately 0.34 microns (um) for CMOS 0.13 um technologies. Spacing the contacts 526 further apart than minimum design rules is one method of employing segmentation. Segmentation of the ESD discharge path within the fingers of MOS transistors initiates a current re-distribution mechanism and enhances current uniformity at the onset of current crowding, thus supporting a good ESD performance within a single finger. The triggering of multiple fingers is achieved by the above describe method of employing minimum source-contact-to-gate and minimum drain-contact-to-gate spacings resulting in a minimum source-to-source spacing, and thus achieving an optimal inter-finger coupling. As shown in FIG. 5A, the contact pitch (P) is illustratively increased to approximately 0.68 microns, which in this instance is referred to as a double contact pitch (i.e., 2× MDR). It is noted that the contact pitch may be increased in a range of 1× MDR to 3× MDR. However, increasing contact pitch above 5× MDR may be detrimental because the current spreading along the transistor width deteriorates and the fewer contact holes will not be able to feed sufficient current to the device fingers.

It is noted that the upper limit for the contact pitch may be calculated by measuring the high current robustness for contacts on N+ layers. Typically, the high current robustness per contact ($I_{max,ct}$) is about 10 to 20 mA. For an expected (i.e., target) high current performance ($I_{target}$) in the multi-finger transistor, per micron (um) width, the maximum pitch ($P_{max}$) is calculated as: $P_{max}=I_{max,ct}/(I_{target}\times 2)$, where the factor 2 accounts for the fact that each row of contacts provides the current for two transistor fingers. For example, for a current target of 10 mA/um and a contact high current robustness of 20 mA, the maximum pitch is 1 um.

Additionally, micro-ballasting is also provided to create multiple parallel small channels, which feed the current uniformly to the transistor. As shown in the exploded view in FIG. 5B, resistive channels (ballasting resistors) 528 are provided from each contact hole 526 to the gate 324. For example, resistive channels 528 are extended from each contact hole $\mathbf{526}_S$ in the source 320 to the gate $\mathbf{324}_1$, as well as from the contact holes $\mathbf{526}_D$ in the drain 322 to the gates $\mathbf{324}_1$.and $\mathbf{324}_2$. Moreover, resistive elements 530 are also present, which occur naturally between adjacent contact holes 526 within each drain and source region 322 and 320. It is noted that in FIGS. 6A and 6*b*, steps are taken to eliminate such resistive elements 530, as illustratively shown and discussed below with respect to FIGS. 6A and 6B. Such resistive elements 530 reduce the segmentation and channeling effect, and accordingly, the micro-ballasting. For a detailed understanding of providing active area ballasting, the reader is directed to commonly assigned patent application Ser. No. 10/159,801, filed May 31, 2002, which is incorporated by reference herein in its entirety.

Figure 6A:
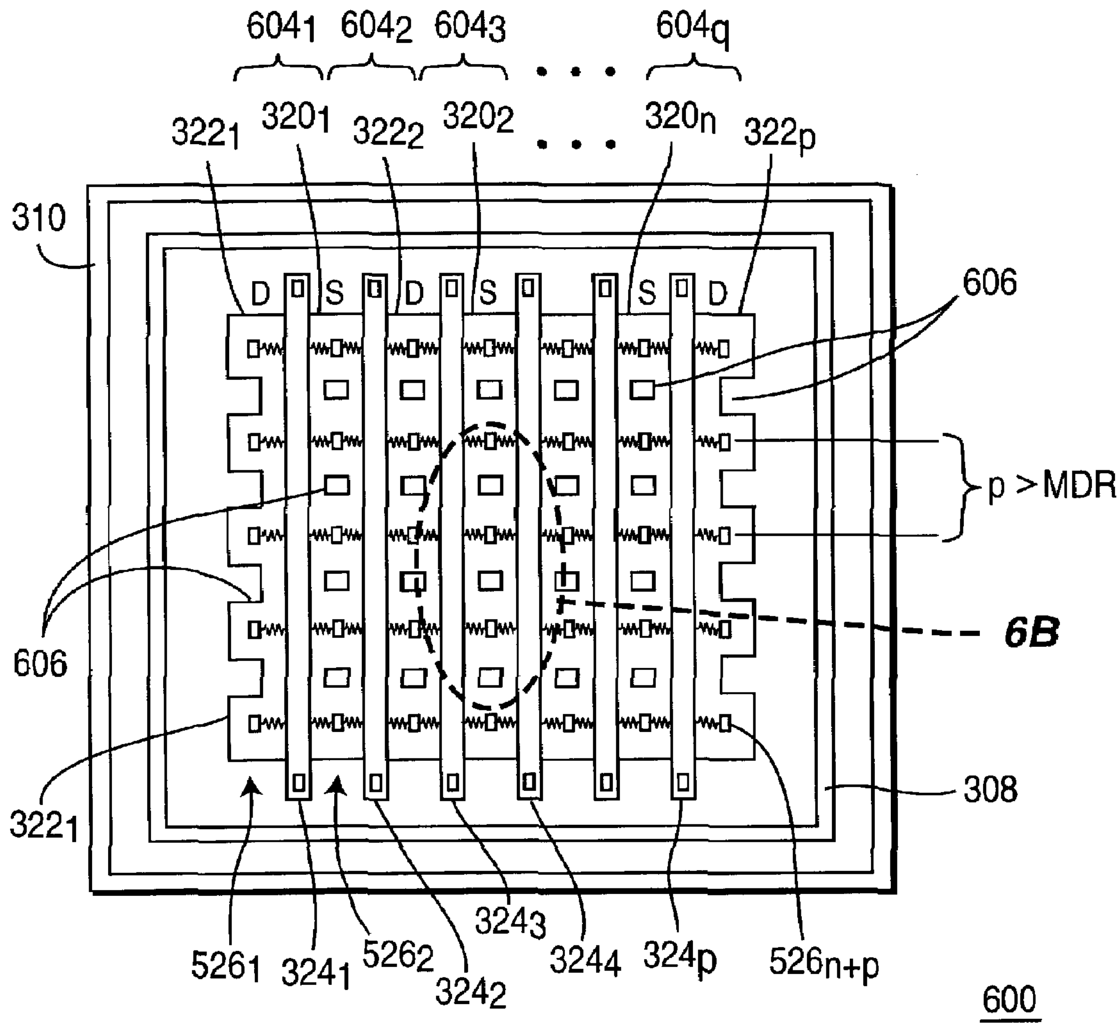
FIGS. 6A and 6B together depict a top-view of a fourth embodiment of a MOS driver of the present invention.
Figure 6B:
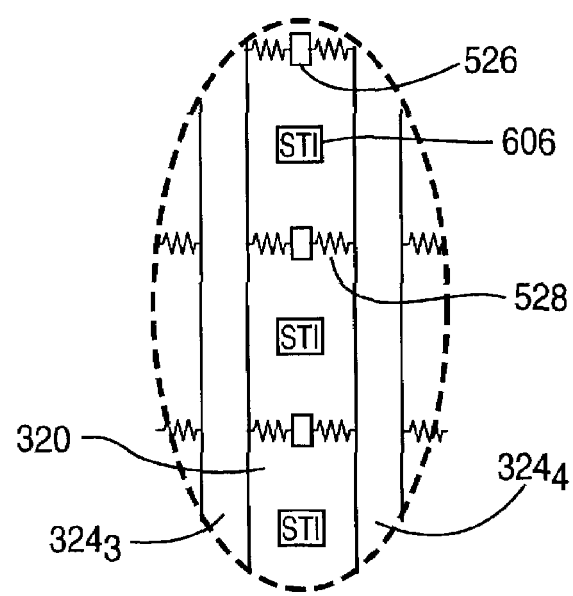

FIGS. 6A and 6B together depict a top-view of a fourth embodiment of a MOS driver 600 of the present invention. In particular, FIG. 6A depicts a fully-silicided MOS driver 600 utilizing a segmentation technique hereinafter termed "active area segmentation." The layout shown in FIG. 6A is the same as the layout of FIG. 5A, except that the active area of the transistor finger is cut out between the contact spaces, thus further intensifying the segmentation effect. In particular, shallow trench isolation (STI) 606 is provided between the active areas to eliminate the resistive elements 530 (shown in FIGS. 5A and 5B). Further, note that in FIG. 6B, the resistive elements 530 between adjacent contacts 526, as shown in FIG. 5B, are no longer present.

Referring to FIG. 6A, each finger 604 comprises a drain and source region 322 and 320 having a gate region 324 disposed over a channel 421 therebetween, as discussed above with respect to FIG. 4. Each drain region 322 and source region 320 is respectively provided with a row of contacts 526, as discussed above with regard to FIGS. 5A and 5B. It is noted that the geometrical distances according of the new structure determine the contact pitch P. That is, the introduction of the shallow trench isolation (STI) 606 between the contacts 526 induces a contact pitch of approximately 0.68 microns.

Islands of shallow trench isolation 606 are formed (interspersed) respectively between the contact holes 526 of each row of each drain and source region 322 and 320 of each finger 604. Specifically, these islands of STI 606 are formed in the active silicon of the source and drain regions 320 and 322. The STI islands 606 help segment or separate the current flow between each pair of contacts. That is, the advantage of the active area segmentation over the contact pitch segmentation is a stronger separation of the current-confining resistive channel regions 528 for the current flow. This is achieved by the addition of the STI islands 606, which prevents the formation of the resistive elements 530, as shown in FIGS. 5A and 5B.

Figure 8A:
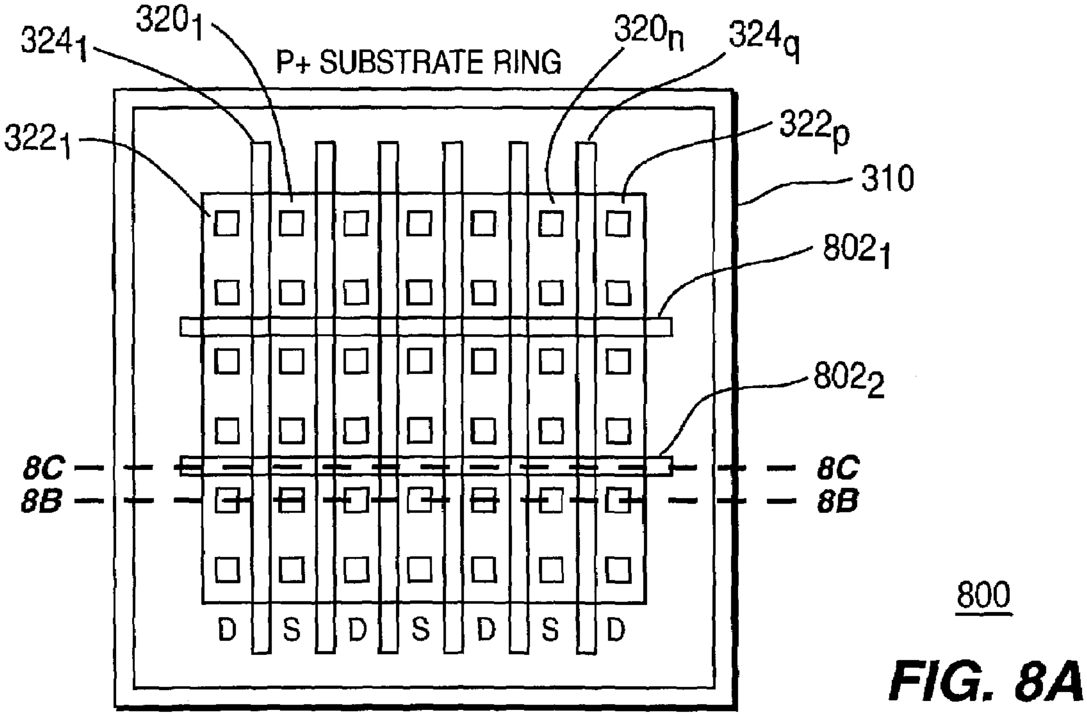
FIGS. 8A, 8B, and 8C respectively depict a top-view and two side views of a fifth embodiment of a MOS driver of the present invention.
Figure 8B:
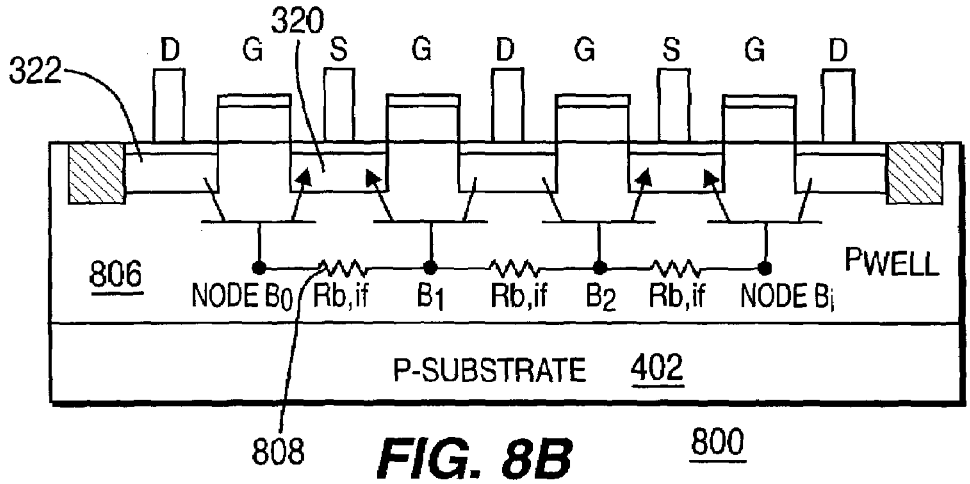
Figure 8C:
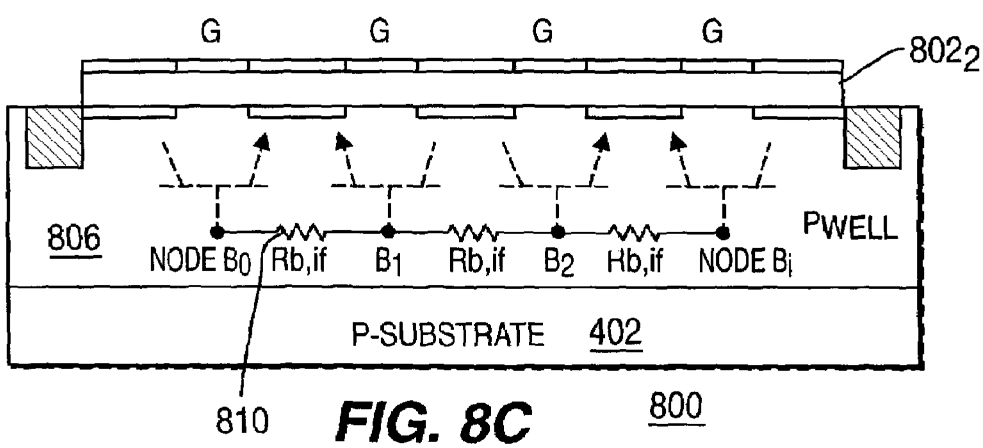

FIGS. 8A, 8B, and 8C respectively depict a top-view and two side views of a fifth embodiment of a MOS driver 800 of the present invention. In particular, the top-view of FIG. 8A is the same as shown in the embodiment of FIG. 3, except that a plurality of perpendicular polysilicon gates (e.g., $\mathbf{802}_1$ and $\mathbf{802}_2$, collectively polysilicon gates 802) is provided between various contact rows to provide improved base-to-base coupling of the parasitic bipolar transistors. The top-view layout of FIG. 8A illustratively shows how such perpendicular poly stripes 802 may be placed over a multi-finger MOS transistor 800.

FIG. 8B depicts a conventional cross-sectional view of the MOS driver 800 along lines 8B—8B of FIG. 8A. The cross-sectional view of FIG. 8B illustrates the inter-finger base resistance $R_{b,if}$ of the parasitic bipolar transistors. FIG. 8C depicts a second cross-sectional view of the MOS driver 800 along lines 8C—8C of FIG. 8A. The second cross-sectional view of FIG. 8C illustrates the inter-finger base resistance under the gate $R_{b,ifg}$ of the parasitic bipolar transistors (drawn in phantom) where the polysilicon gate $802_2$ is illustratively provided. It is noted that the drain, source, and Pwell regions 322, 320, and 806 of the transistor 800 form the parasitic bipolar transistors illustratively shown in FIG. 8B, and are accordingly only shown in phantom in FIG. 8C for better understanding of the invention.

The perpendicular poly silicon gates 802 help to improve the inter-finger coupling, as the cross-sectional depth of the silicon material for the Pwell (in FIG. 8C) is increased from the depth as in the conventional case (i.e., having N+ drain diffusion regions shown in FIG. 8B). The greater cross-section in the Pwell 806 reduces the inter-finger base resistance $R_{b,if}$, such that the inter-finger base resistance $R_{b,ifg}$ under the perpendicular poly silicon gates 802 (FIG. 8C) is lower than the conventional inter-finger base resistance $R_{b,if}$ (FIG. 8B) thereby further improving the inter-finger coupling. The inter-finger base resistance is present between the internal base nodes $B_0$ and $B_i$ (where i is an integer greater than zero) and is referred to as the "base-to-base" resistance. The perpendicular poly silicon gates 802 also help to improve the inter-finger coupling, as they interrupt the drain and source regions (equivalent collector and emitter regions of the parasitic bipolar transistors). As such they contribute to a better propagation of the triggering throughout the multi-finger MOS transistor.

Note further, that the corresponding base nodes $B_i$ of FIGS. 8B and 8C are identical. As such, the corresponding inter-finger base resistors $R_{b,if}$ and $R_{b,ifg}$ are in parallel. Moreover, the deep Nwell layer, as shown in FIG. 4, is not shown in this fifth embodiment, but may be optionally included as well.

Accordingly, the ESD MOS protection embodiments of the present invention utilize the minimum design rules typically applied to only the core or functional elements and circuitry of an IC, while increasing ESD performance per silicon area, thereby allowing for very compact and ESD-robust I/O cell design. Further, high output drive current performance is still provided because the fully-silicided junctions are maintained in contrast to highly resistive silicide-blocked driver transistors. Moreover, the fully-silicided junctions enable very low ESD clamping behavior due to the minimum dynamic on-resistance (i.e., $R_{ON}$ of FIG. 7). Additionally, junction capacitance is reduced because the active area becomes small, which is beneficial for RF applications.

Although various embodiments that incorporate the teachings of the present invention have been shown and described in detail herein, those skilled in the art can readily devise many other varied embodiments that still incorporate these teachings.

What is claimed is:

1. An electrostatic discharge (ESD) MOS transistor including a plurality of interleaved fingers, said MOS transistor formed in an I/O periphery of an integrated circuit (IC) for providing ESD protection for said IC, said MOS transistor comprising:

a P-substrate;

a Pwell disposed over said P-substrate;

said plurality of interleaved fingers each comprising:

an N+ source region;

an N+ drain region; and a gate region formed over a channel region disposed between said source and drain regions, wherein each source and drain comprise a row of contacts respectively formed in a row of contact holes that is shared by an adjacent finger, wherein each contact hole in each said contact row has a distance to said gate region defined under minimum design rules for core functional elements of said IC and having active-area segmentation interleaved between said contacts in each said row of contacts; and wherein said Pwell forms a common parasitic bipolar junction transistor base for contemporaneously triggering each finger of said MOS transistor during an ESD event.

2. The MOS transistor of claim 1 wherein each said row of contacts has a contact pitch substantially equal to a contact pitch for said core functional elements of said IC under minimum design rules.

3. The MOS transistor of claim 1, wherein said drain regions are adapted for coupling to one of an I/O pad and a power supply; and said source regions and said P-substrate are adapted for coupling to ground.

4. The MOS transistor of claim 1, wherein said gate regions are adapted for coupling to ground.

5. The MOS transistor of claim 1, wherein the gate regions are adapted for coupling to a pre-driver circuit.

6. The MOS transistor of claim 1 wherein each source and drain region of each finger further comprises a ballast resistive element coupled between each contact and said gate.

7. The MOS transistor of claim 1 further comprising a deep Nwell disposed between said P-substrate and said Pwell.

8. The MOS transistor of claim 7 further comprising a lateral Nwell ring circumscribing said plurality of fingers, wherein said lateral Nwell ring contacts said deep Nwell, thereby completely isolating said Pwell from said P-substrate.

9. The MOS transistor of claim 8 further comprising a P+ substrate-tie ring circumscribing said lateral Nwell ring.

10. The MOS transistor of claim 1 further comprising a lateral Nwell ring circumscribing said plurality of fingers.

11. The MOS transistor of claim 10 further comprising a P+ substrate-tie ring circumscribing said lateral Nwell ring.

12. The MOS transistor of claim 1 further comprising a P+ substrate-tie ring circumscribing said plurality of fingers.

13. The MOS transistor of claim 1, further comprising contact pitch segmentation, wherein the contacts of said row of contacts have a pitch greater than a pitch for said core functional elements of said IC under minimum design rules.

14. The MOS transistor of claim 13 wherein each source and drain region of each finger further comprises a ballast resistive element coupled between each contact and said gate.

15. The MOS transistor of claim 1, wherein said active-area segmentation comprises providing shallow trench isolation regions respectively interspersed between contacts in each said row of contacts in each source and drain region.

16. The MOS transistor of claim 1, further comprising a plurality of perpendicular polysilicon gates formed perpendicular to said rows of contact holes and across said source, gate, and drain regions of each said plurality of interleaved fingers, wherein the perpendicular polysilicon gates are in electrical contact with said gate regions of said MOS transistor.

17. The MOS transistor of claim 1, wherein each gate region is adapted for coupling to a respective source region.

18. An electrostatic discharge (ESD) PMOS transistor including a plurality of interleaved fingers, said MOS transistor formed in an I/O periphery of an integrated circuit (IC)

for providing ESD protection for said IC, said MOS transistor comprising:

a P-substrate;

an Nwell disposed over said P-substrate;

said plurality of interleaved fingers each comprising:

a P+ source region;

a P+ drain region; and a gate region formed over a channel region disposed between said source and drain regions, wherein each source and drain comprise a row of contacts respectively formed in a row of contact holes that is shared by an adjacent finger, each contact hole in each said contact row having a distance to said gate region defined under minimum design rules for core functional elements of said IC and having active-area segmentation interleaved between said contacts in each said row of contacts; and wherein said Nwell forms a common parasitic PNP bipolar junction transistor base for contemporaneously triggering each finger of said MOS transistor during an ESD event.

19. The MOS transistor of claim 18 wherein each said row of contacts has a contact pitch substantially equal to a contact pitch for said core functional elements of said IC under minimum design rules.

20. The MOS transistor of claim 18, wherein said drain regions are adapted for coupling to one of an I/O pad and ground; and said source regions and said N-well are adapted for coupling to a power supply pad.

21. The MOS transistor of claim 18, wherein said gate regions are adapted for coupling to a power supply pad.

22. The MOS transistor of claim 18, wherein the gate regions are adapted for coupling to a pre-driver circuit.

23. The MOS transistor of claim 18 wherein each source and drain region of each finger further comprises a ballast resistive element coupled between each contact and said gate.

24. The MOS transistor of claim 18, further comprising contact pitch segmentation, wherein each contact of said row of contacts has a pitch greater than a pitch for said core functional elements of said IC under minimum design rules.

25. The MOS transistor of claim 24 wherein each source and drain region of each finger further comprises a ballast resistive element coupled between each contact and said gate.

26. The MOS transistor of claim 18, wherein said active-area segmentation comprises providing shallow trench isolation regions respectively interspersed between contacts in each row of each source and drain region.

27. The MOS transistor of claim 18, further comprising a plurality of perpendicular polysilicon gates formed perpendicular to said rows of contact holes and across said source, gate, and drain regions of each said plurality of interleaved fingers, wherein the perpendicular polysilicon gates are electrical contact with said gate regions of said MOS transistor.

28. An electrostatic discharge (ESD) MOS transistor formed in an I/O periphery of an integrated circuit (IC) for providing ESD protection for said IC, said MOS transistor comprising:

a plurality of interleaved fingers, where each finger comprises a gate region formed over a channel region disposed between a source region and a drain region, wherein each source and drain comprise a row of contacts respectively formed in a row of contact holes that is shared by an adjacent finger, wherein each contact hole in each said contact row has a distance to said gate region defined under minimum design rules for core functional elements of said IC and having active-area segmentation interleaved between said contacts in each said row of contacts.

29. The MOS transistor of claim 28, wherein said active-area segmentation comprises providing shallow trench isolation regions respectively interspersed between contacts in each row of each source and drain region.

* * * * *

UNITED STATES PATENT AND TRADEMARK OFFICE

CERTIFICATE OF CORRECTION

PATENT NO. : 7,005,708 B2
APPLICATION NO. : 10/435817
DATED : February 28, 2006
INVENTOR(S) : Margens et al.

It is certified that error appears in the above-identified patent and that said Letters Patent is hereby corrected as shown below:

DRAWINGS,

DELETE DRAWING FIG. 8C, AND SUBSTITUTE DRAWING FIG. 8C AS SHOWN BELOW.

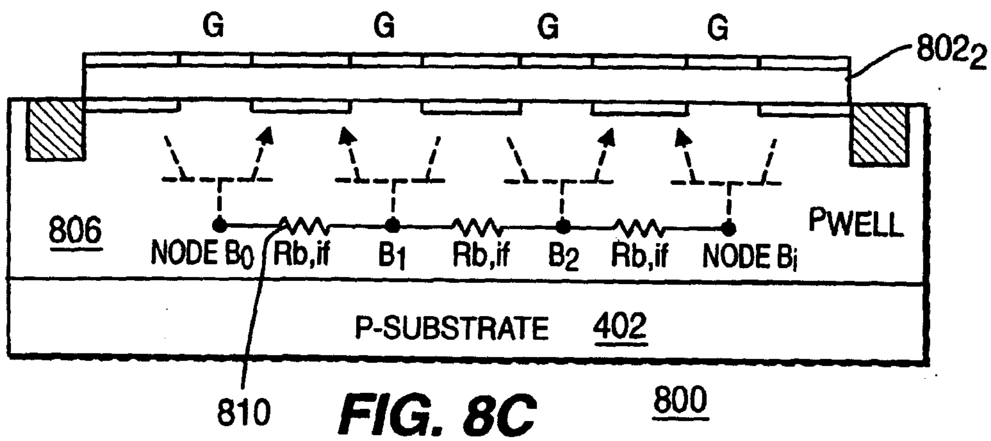

FIG. 8C

Signed and Sealed this

Seventeenth Day of October, 2006

JON W. DUDAS
*Director of the United States Patent and Trademark Office*